United States Patent [19]

Frampton

[11] Patent Number: 4,651,415

[45] Date of Patent: Mar. 24, 1987

[54] LEADED CHIP CARRIER

[75] Inventor: Tom J. Frampton, Poway, Calif.

[73] Assignee: Diacon, Inc., San Diego, Calif.

[21] Appl. No.: 715,198

[22] Filed: Mar. 22, 1985

[51] Int. Cl.$^4$ ............................................. H01L 21/68
[52] U.S. Cl. ................................... 29/827; 174/52 FP; 29/416
[58] Field of Search ...................... 174/52 FP; 357/70; 29/827, 830

[56] References Cited

U.S. PATENT DOCUMENTS

| | | | |
|---|---|---|---|
| 3,340,347 | 9/1967 | Spiegler | 174/52 FP |
| 3,665,592 | 5/1972 | Apospors | 174/52 FP X |
| 3,697,666 | 10/1972 | Wakley et al. | 174/52 FP X |
| 3,778,686 | 12/1973 | Galvin et al. | 357/80 |
| 3,909,934 | 10/1975 | Epple | 29/827 |
| 3,934,336 | 1/1976 | Morse | 29/827 |
| 4,007,479 | 2/1977 | Kowalski | 357/70 |
| 4,025,716 | 5/1977 | Morse | 174/52 FP |
| 4,135,038 | 1/1979 | Takami et al. | 174/52 FP X |
| 4,289,922 | 9/1981 | Devlin | 174/52 FP |
| 4,387,388 | 6/1983 | Zakhariya | 357/74 |
| 4,404,745 | 9/1983 | Resneau et al. | 29/841 |
| 4,410,906 | 10/1983 | Grabbe | 357/80 |
| 4,412,093 | 10/1983 | Wildeboer | 174/52 FP |
| 4,453,176 | 6/1984 | Chance et al. | 357/51 |
| 4,504,887 | 3/1985 | Bakermans et al. | 361/399 |
| 4,513,355 | 4/1985 | Schroeder et al. | 361/403 |

Primary Examiner—Arthur T. Grimley
Assistant Examiner—D. A. Tone
Attorney, Agent, or Firm—Joseph H. Smith

[57] ABSTRACT

A four quadrant leadframe, base and window assembly and assembly method therefor are disclosed which are suited for fabrication of leaded integrated circuit (IC) chip carriers having electrical contacts on all four sides of the package, lead spacing as small as 0.020 inch, and lead counts exceeding 164 total leads.

15 Claims, 7 Drawing Figures

LEADED CHIP CARRIER

TECHNICAL FIELD

This invention relates generally to the field of packages for semiconductor devices, and particularly to integrated circuit (IC) chip carriers, leadframes, and leadframe assemblies.

BACKGROUND OF THE INVENTION

At the present time, the majority of IC chips are packaged in a dual-in-line package configuration, with packages having 4 to 64 leads with 0.100 inch external spacing. The dual-in-line package has generally proven inexpensive and reliable in configurations having up to 24 leads. However, above 24 leads, the dual-in-line package becomes less desirable. This is because, generally, the internal lead density increases with lead count and it becomes very difficult to accurately maintain sufficiently precise internal lead dimensions for dual-in-line packages above 24 leads as required by subsequent semiconductor assembly.

The IC industry is, however, moving toward higher and higher lead count applications with packages of 68 to 164 leads on the horizon. To package the larger devices, workers have begun to use packages called chip carriers. The chip carrier has leads or contacts on all four sides of the package (when viewed from above) and the contact or lead spacing is usually 0.050 inch or smaller, with some applications using a lead spacing as small as 0.020 inch. Because of the reduced lead spacing as compared to the dual-in-line package, the chip carriers are generally soldered directly to the surface of printed circuit boards rather than being mounted through holes in the printed circuit board as for the dual-in-line packages, since printed circuit boards cannot accurately maintain 0.050 inch hole spacing.

Although the chip carrier is mounted directly to the surface of the circuit boards, it is still desirable to have complient leads eminating out from the package body. In such a leaded chip carrier configuration, the leads serve to absorb the stress caused by the mismatch of thermal coefficients of expansion between the IC package and the circuit board. Unfortunately, the leadframes needed for such high lead count packages are very costly to produce.

Chip carrier leadframes are machine stamped as a series of units 100 as shown in FIG. 1 in a continuous metal strip. After stamping, the strip is rolled onto a reel containing a desired number of leadframes. The reel is then unrolled and processed through a first masking operation to mask all areas except the internal fingers 110. After masking, aluminum is vapor deposited on the exposed internal lead fingers 110. The first mask is then removed leaving selectively vapor deposited aluminum on the internal lead fingers 110. In some applications, gold plating is also required on the external leads 120. This is done by masking the leadframes 100 a second time, gold electroplating the exposed external leads 120, and then removing the second mask. The continuous metal strip is then cut into individual units 100 for subsequent package manufacturing.

Unfortunately, the precision stamping tools needed for producing the units 100 are very expensive, require a relatively long time to fabricate, and have significant maintenance and repair costs due to their complexity. In addition, the stamping yields are often low because of the complex nature of the stamping tools. Also, vapor depositing aluminum is an expensive operation and the resulting deposited aluminum is too soft, too thin and too weakly bound to the underlying metal for many applications.

Finally, the use of two separate masks for selectively applying aluminum and gold is quite expensive.

SUMMARY OF THE INVENTION

The present invention overcomes many of the problems in the prior art by fabricating the leadframes as four separate subframe quadrants. Each subframe is fully stamped and separated from a metal strip which can be previously clad with a stripe of rolled aluminum. Each subframe is thus an integral leadframe within itself.

Four separate quadrant subframes are then positioned in a fixture and located by pins. A ceramic window frame is then attached to the four quadrants with low temperature devitrifying glass to permanently mechanically couple the four separate subframes. After window frame attachment, the central linking tabs of each quadrant subframe are removed. A base is then attached via low temperature devitrifying glass to the four quadrant subframes on the side opposite the window frame to complete the leaded chip carrier.

Using the present invention, lead stamping tool and leadframe costs can be reduced by about 75% over conventional designs. In addition, the quality of the aluminum surfaces are greatly enhanced because of the elimination of the use of vapor deposited aluminum.

DETAILED DESCRIPTION OF THE INVENTION

Figure 1:
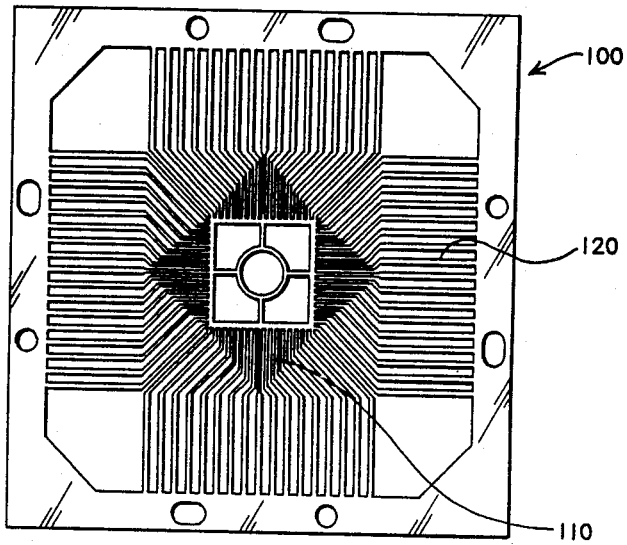
FIG. 1 shows a conventional leadframe used for leaded chip carriers.
Figure 2A:
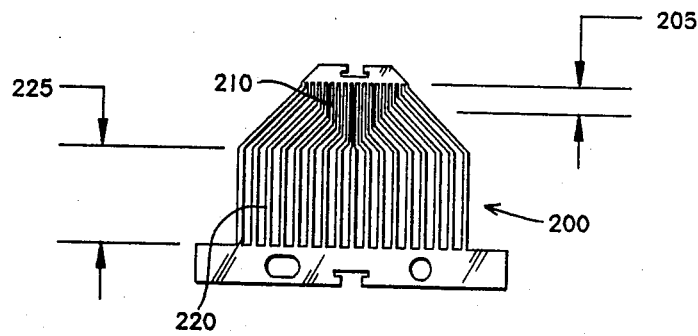
FIG. 2A is a single quadrant subframe according to a preferred embodiment of the present invention.
Figure 3:
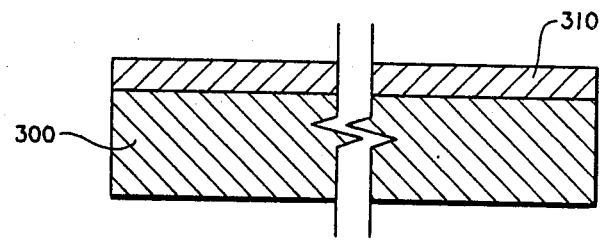
FIG. 3 is a raw strip of metal for fabricating subframes as shown in FIG. 2.

FIG. 2A shows an individual quadrant subframe 200 according to the present invention. Each subframe 200 is stamped out of a thin strip of metal 300 typically 0.0075 inches thick as shown in FIG. 3 composed of a metal such as Alloy 42 available from Carpenter Corporation. Alloy 42 is a metal selected to have a coefficient of thermal expansion matching devitrifying glass such as that available as sealing glass CV-111 from Owens Illinois Corporation or #7583 from Corning Glass Company. In order to optimize the consistency of the resulting leadframes, prior to stamping, the raw metal strip 300 is clad on one side with a stripe 310 of aluminum typically 0.0003 inches thick in the region 205 from which inner fingers 210 are stamped. The clad aluminum stripe 310 provides a superior surface for subsequent thermal processing and IC wire bonding since the clad aluminum is a rolled, non-porous, continuous sheet.

Figure 2B:
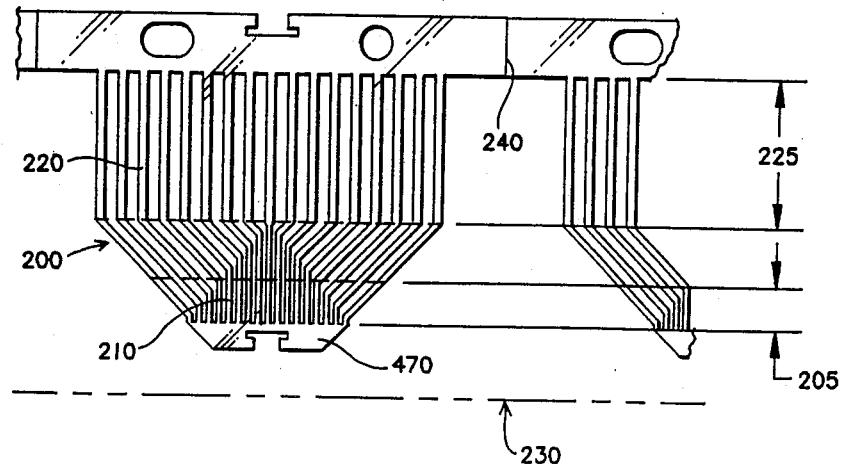
FIG. 2B is a strip of subframes as shown in FIG. 2A.

If external gold or nickel plated leads 220 are needed, the subframes 200 are left in a continuous strip 230 as shown in FIG. 2B during the stamping operation. The continuous strip 230 is then processed through a gold or nickel electroplating bath for selective plating in region 225. The strips 230 do not need to be masked, because all plating is done from one edge and only the depth of the strip into the baths needs to be controlled. If desired, aluminum can also be electroplated in the same manner in region 205 rather than clad before stamping. After the external leads 220 are plated, the strip 230 is separated along a half-etched line 240 into individual subframe units 200 as in FIG. 2A.

Figure 4:
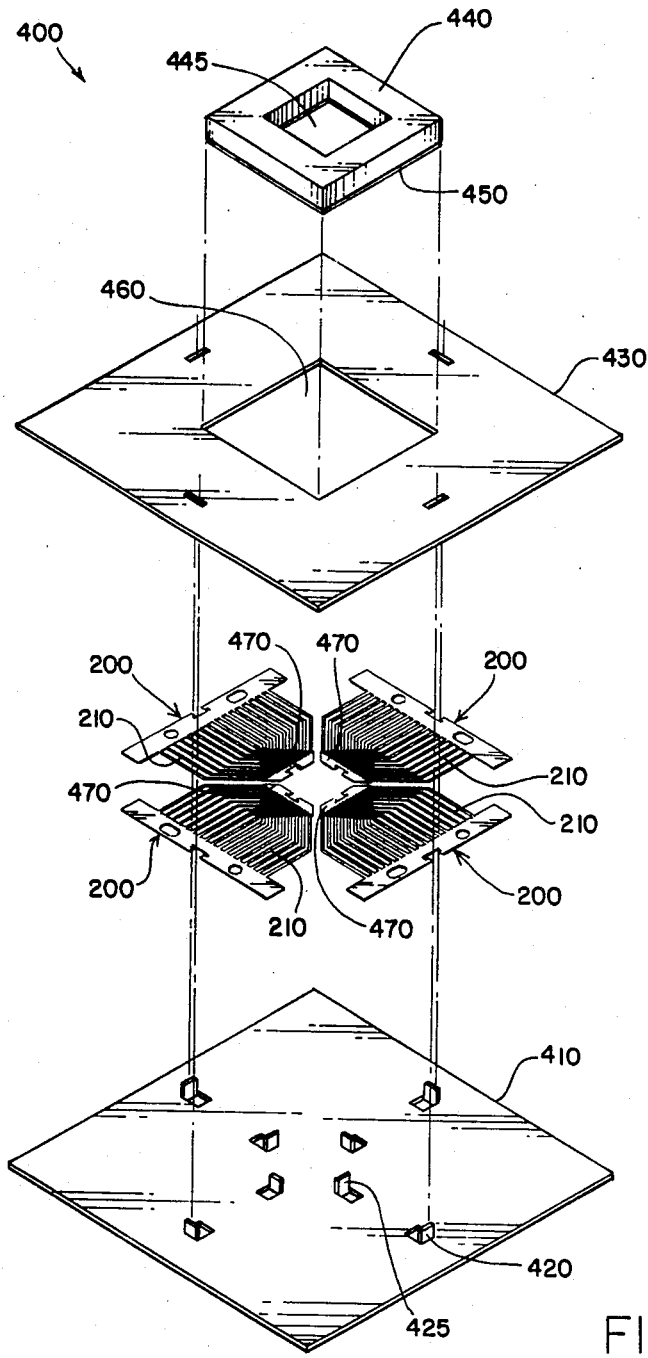
FIG. 4 is an exploded view of a leaded chip carrier assembly according to the present invention.
Figure 5:
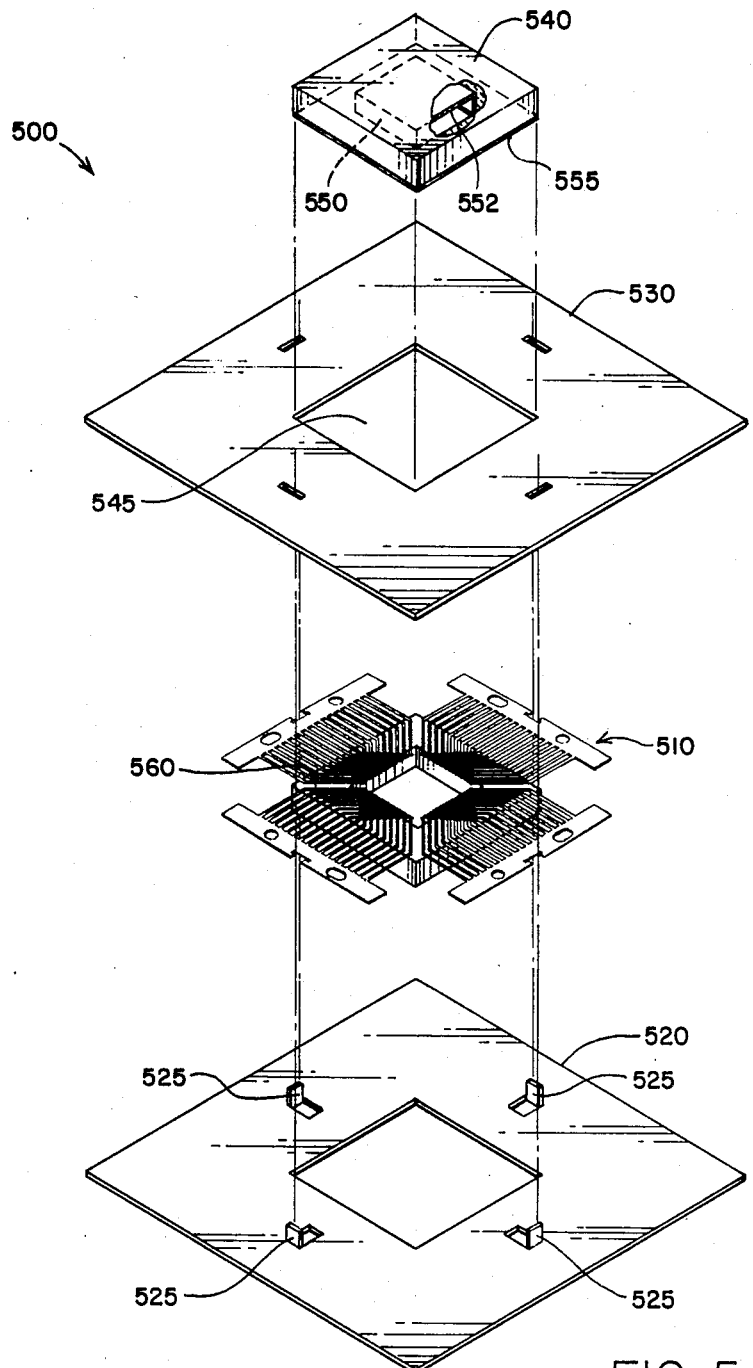
FIG. 5 is an exploded view of a package assembly according to the present invention.

The individual subframes 200 are then assembled into leadframes as shown in FIG. 4. Four subframes 200 are placed on a leadframe locating plate 410, each subframe utilizing formed tabs such as 420 and 425 on the leadframe locating plate 410. Like the subframes 200, the leadframe locating plate 410 is typically fabricated from Alloy 42 to match the low thermal expansion coefficient of devitrifying glass. The tabs are generally formed by etching holes through the locating plate 410 and then bending the tabs upward perpendicular to the plate. A window frame locating plate 430 is located above the subframes 200 by means of the formed tabs. A ceramic window frame 440 with low temperature devitrifying sealing glass along the frame surface 450 is then fit within opening 460 in the window frame locating plate 430, the frame 440 having a window 445 therein. The window frame 440 thus lies directly on the four subframes 200 with devitrifying sealing glass therebetween. The entire assembly 400 is then heated at 500° C. for 15 minutes. The devitrifying glass melts during heating and adheres to and seals around the four subframes 200. Because of the properties of devitrifying glass, it becomes a solid after melting when exposed to high temperature over time. Thus, the window frame 440 and the four subframes 200 become an integral unit by the time they are removed from the high temperature environment. The locating plates 410 and 430 are then removed from the integral window frame 440 and four subframes 200. Four center tabs 470 holding the aluminum clad internal leads 210 are then removed leaving a leadframe unit 510 as shown in FIG. 5.

Figure 6:
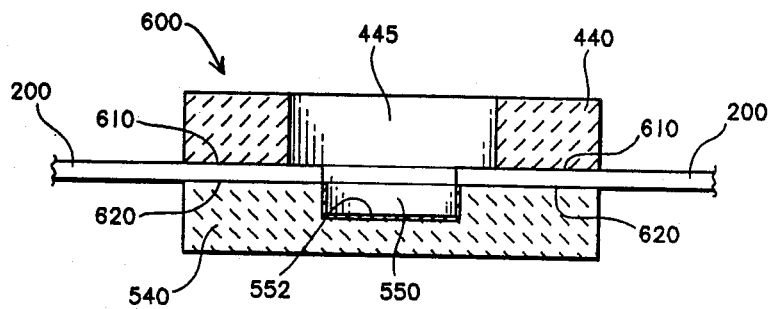
FIG. 6 is a cross-sectional view of a leaded chip carrier assembly according to the present invention.

The leadframe unit 510 is then located on an assembly locating plate 520 by means of formed tabs 525. A base locating plate 530 is then located over the leadframe unit 510 also by means of formed tabs 525. A ceramic base 540 is then located over the leadframe unit 510 by means of hole 545 within the base locating plate 530. The ceramic base 540 has a cavity 550 generally coated with a metal 552, most typically gold, for semiconductor attachment. The surface 555 surrounding the cavity 550 is coated with low temperature devitrifying glass. The entire assembly 500 is then heated at 500° C. for 15 minutes. Because of the properties of devitrifying glass, the glass 560 on the leadframe unit 510 does not re-melt, and the leadframe unit 510 remains held in a precise position between locating plates 520 and 530 during the second heating cycle. However, the glass on surface 555 has not previously been exposed to a high temperature over time. Thus, the glass on surface 555 melts and adheres to and seals between the ceramic base 540 and the leadframe unit 510. After the assembly 500 is removed from the high temperature environment, locating plates 520 and 530 are removed leaving a leaded chip carrier assembly 600 as shown in FIG. 6 with hermetic seals both along the surface 610 between the window frame 440 and the four subframes 200 and along surface 620 between the base 540 and the four subframes 200.

I claim:
1. In a method for fabricating a leaded chip carrier, the steps comprising:
   (a) separating a multiplicity of individual electrically conductive subframes from a thin metallic strip, each of the multiplicity of subframes having a plurality of internal leads coupled in a one-to-one relationship to a plurality of external leads;
   (b) aligning a plurality of subframes selected from the multiplicity of individual subframes between a leadframe locating plate and a window frame locating plate;
   (c) aligning a window frame shaped member having a frame hole therethrough within the window frame locating plate, said window frame shaped member abutting a first surface of each of the plurality of subframes aligned between the leadframe locating plate and the window frame locating plate;
   (d) permanently coupling the window frame shaped member to the plurality of subframes to form a leadframe unit; and
   (e) removing the leadframe locating plate and the window frame locating plate.
2. In a method as in claim 1 after step (d), the further step comprising;
   (f) removing linking tabs holding in fixed relationship the internal leads on each of the plurality of subframes.
3. In a method as in claim 1 prior to step (a), the step comprising:
   (g) cladding the thin metallic strip with a metal in at least a portion of the strip from which the internal leads are separated.
4. In a method as in claim 1, the further steps comprising:
   (h) aligning the leadframe unit between an assembly locating plate and a base locating plate;
   (i) axially aligning a base member within the base locating plate, said base member abutting a second surface of each of the plurality subframes within the leadframe unit;
   (j) permanently coupling the base member to the leadframe unit; and
   (k) removing the assembly locating plate and the base locating plate.
5. In a method as in claim 4 prior to step (i), the steps comprising:
   (l) providing a cavity within the base member to be axially aligned with and facing the frame hole; and
   (m) coating the cavity with a metal.
6. In a method as in claim 4 wherein glass is provided between the base member and the second surface of each of the plurality of subframes within the leadframe unit, and wherein step (j) comprises devitrifying the glass.
7. In a method as in claim 1, wherein glass is provided between the window frame shaped member and the first surface of each of the plurality of subframes, and wherein step (d) comprises devitrifying the glass.
8. In a method for fabricating a leaded chip carrier, the steps comprising:
   (a) partially separating a multiplicity of individual electrically conductive subframes from a thin metallic strip, each of the multiplicity of subframes having a plurality of internal leads coupled in a one-to-one relationship to a plurality of external leads;
(b) plating at least a portion of the external leads on each of the multiplicity of subframes with a metal;
(c) aligning a plurality of subframes selected from the multiplicity of individual subframes between a leadframe locating plate and window frame locating plate;
(d) aligning a window frame shaped member having a frame hole therethrough within the window frame locating plate, said window frame shaped member abutting a first surface of each of the plurality of subframes aligned between the leadframe locating plate and the window frame locating plate;
(e) permanently coupling the window frame shaped member to the plurality of subframes to form a leadframe unit; and
(f) removing the leadframe locating plate and the window frame locating plate.

9. In a method as in claim 8 after step (e), the further step comprising:
(g) removing linking tabs holding in fixed relationship the internal leads on each of the plurality of subframes.

10. In a method as in claim 8 prior to step (a), the step comprising:
(h) cladding the thin metallic strip with a metal in at least a portion of the strip from which the internal leads are separated.

11. In a method as in claim 8, the further steps comprising:
(i) aligning the leadframe unit between an assembly locating plate and a base locating plate;
(j) axially aligning a base member within the base locating plate, said base member abutting a second surface of each of the plurality of subframes within the leadframe unit;
(k) permanently coupling the base member to the leadframe unit; and
(l) removing the assembly locating plate and the base locating plate.

12. In a method as in claim 11 prior to step (j), the steps comprising:
(m) providing a cavity within the base member to be axially aligned with and facing the frame hole; and
(n) coating the cavity with a metal.

13. In a method as in claim 11 wherein glass is provided between the base member and the second surface of each of the plurality of subframes within the leadframe unit, and wherein step (k) comprises devitrifying the glass.

14. In a method as in claim 8 wherein glass is provided between the window frame shaped member and the first surface of each of the plurality of subframes, and wherein step (e) comprises devitrifying the glass.

15. In a method as in claim 8, the further step comprising:
(o) completely separating each of the multiplicity of subframes from one another.

* * * * *